United States Patent [19]
Douse et al.

[11] Patent Number: 6,014,046
[45] Date of Patent: *Jan. 11, 2000

[54] OFF CHIP DRIVER (OCD) WITH VARIABLE DRIVE CAPABILITY FOR NOISE CONTROL

[75] Inventors: David E. Douse, Hinseburg; Scott C. Lewis, Essex Junction; Thomas M. Maffitt, Burlington, all of Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/904,411

[22] Filed: Jul. 31, 1997

[51] Int. Cl.⁷ .............................. H03B 1/00; H03K 3/00
[52] U.S. Cl. .......................... 327/112; 327/379; 326/27; 326/87
[58] Field of Search ..................... 327/108, 112, 327/379, 380; 326/26, 27, 87, 85

[56] References Cited

U.S. PATENT DOCUMENTS

| | | | |
|---|---|---|---|
| 3,736,522 | 5/1973 | Padgett | 327/112 |
| 4,567,378 | 1/1986 | Raver | 307/270 |
| 5,120,999 | 6/1992 | Schreck et al. | 326/27 |
| 5,122,690 | 6/1992 | Bianchi | 307/475 |
| 5,126,588 | 6/1992 | Reichmeyer et al. | 307/270 |
| 5,138,195 | 8/1992 | Satou et al. | 307/446 |
| 5,206,544 | 4/1993 | Chen et al. | 326/26 |
| 5,315,173 | 5/1994 | Lee et al. | 326/26 |
| 5,355,029 | 10/1994 | Houghton et al. | 326/26 |
| 5,367,210 | 11/1994 | Lipp | 326/26 |
| 5,414,312 | 5/1995 | Wong | 326/83 |
| 5,430,335 | 7/1995 | Tanoi | 327/170 |
| 5,438,278 | 8/1995 | Wong et al. | 326/27 |
| 5,440,258 | 8/1995 | Galbi et al. | 327/112 |
| 5,491,436 | 2/1996 | Austin | 327/108 |
| 5,512,844 | 4/1996 | Nakakura et al. | 326/81 |
| 5,576,635 | 11/1996 | Partovi et al. | 326/27 |
| 5,594,373 | 1/1997 | McClure | 327/108 |
| 5,610,548 | 3/1997 | Masleid | 327/374 |
| 5,629,634 | 5/1997 | Carl et al. | 326/27 |
| 5,684,415 | 11/1997 | McManus | 326/81 |
| 5,796,277 | 8/1998 | Kim et al. | 327/108 |

*Primary Examiner*—Timothy P. Callahan
*Assistant Examiner*—An T. Luu
*Attorney, Agent, or Firm*—Whitham, Curtis & Whitham; Robert A. Walsh

[57] ABSTRACT

An Off Chip Driver (OCD) having a high, a low and a high impedance (Hi-Z) state. The OCD includes an up-level pre-drive, a down-level pre-drive and a driver. The driver mirrors current in the up-level pre-drive and down-level pre-drive. Both pre-drive circuits have an unbalanced input-dependant delay to quickly turn off/on the on and off driver devices and, after a delay, reduce the drive on the turned on device to a steady state level. The delay may have a fixed length set by an inverter chain or may be dependent upon output voltage.

11 Claims, 3 Drawing Sheets

OFF CHIP DRIVER (OCD) WITH VARIABLE DRIVE CAPABILITY FOR NOISE CONTROL

BACKGROUND OF THE INVENTION

1. Field of the Invention

The present invention is related to Integrated Circuits and, more particularly, to integrated circuits with Off Chip Drivers having switching noise compensation.

2. Background Description

Switching noise on power supply lines in Integrated Circuit (IC) packages is a well known problem. Typically, switching noise is the result of a high rate of change of current (di/dt) in the supply line. The noise is the voltage that develops across parasitic inductance (L) in the supply line. Thus, switching noise is, simply, L(di/dt).

Off Chip Drivers (OCDS) are the primary source of switching noise in state of the art IC packages, especially for complementary insulated gate technology (referred to in the art as CMOS) ICs. Each time an OCD switches its output's state, the supply current to the OCD changes from almost no current to a relatively large current and, then, back to almost no current in a few nanoseconds (ns).

This OCD switching current is additive. So, several OCDs switching simultaneously increase switching current (and di/dt) proportionately. Consequently, regardless of how small L is made, eventually, as the number of simultaneously switching OCDs increases, switching noise can become unacceptable.

One source of OCD switching current is a condition that occurs as the OCD is about to switch from one state to another, i.e., from a high to low or vice versa. Typically, an overlap period occurs when the OCD is, effectively, driving in both directions, i.e., a pull up device is pulling the output high and a pull down device is pulling the output low. This overlap and the resulting overlap current, occurs because one device is turning on before the other device has completely turned off. As a result, several techniques have been used to reduce or eliminate the overlap current.

In one such prior art technique, a logic input to the OCD gradually turns off the on-device before turning on the off-device. This prior art technique requires very sensitive OCD timing because, the logic signal must begin (e.g., rise) in anticipation of the change in data and last (remain high) until the on device is turned off, without substantially delaying turning on the off device and, thereby, unduly slowing the output transition. This prior art noise reduction technique also slows forcing tri-state OCDs into their high impedance state.

Thus, there is a need for reducing overlap current in OCDs.

SUMMARY OF THE INVENTION

It is a purpose of the invention to reduce OCD switching noise.

It is another purpose of the present invention to reduce overlap current in OCD driver devices.

It is yet another purpose of the present invention to reduce the rate of change of OCD current without substantially slowing the switching performance of the OCD.

The present invention is an Off Chip Driver (OCD) having a high, a low and a high impedance (Hi-Z) state. The OCD includes an up-level pre-drive, a down-level pre-drive and a driver. The driver mirrors current in the up-level pre-drive and down-level pre-drive. Both pre-drive circuits drive the driver with higher current during transitions than at steady state.

The driver includes an up level FET coupling an up-level supply voltage to an output; a current limiting resistor connected to the output; and a down level FET coupling a down-level supply voltage to the current limiting resistor.

The up-level pre-drive includes a load diode connected to the gate of the up level FET; an up level clamp connected to the load diode for maintaining a fixed current in the diode when the OCD is in its high state; and a transition current path connected to the load diode, and biasing the load diode into a transition current that is mirrored by the driver pull up FET.

The down-level pre-drive includes a down level biasing clamp connected to the gate of the down level FET for maintaining a fixed drive current in the down level FET when the OCD is in its low state; a selectable transition current source biasing the down-level FET during a high to low transition; and a pulse circuit for timing selection of the transition current source.

In one preferred embodiment, the time the transition current path is kept open and the time that the transition current source is selected are each determined by a delayed pre-drive input. In a second embodiment, the output is fedback to determine the times.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
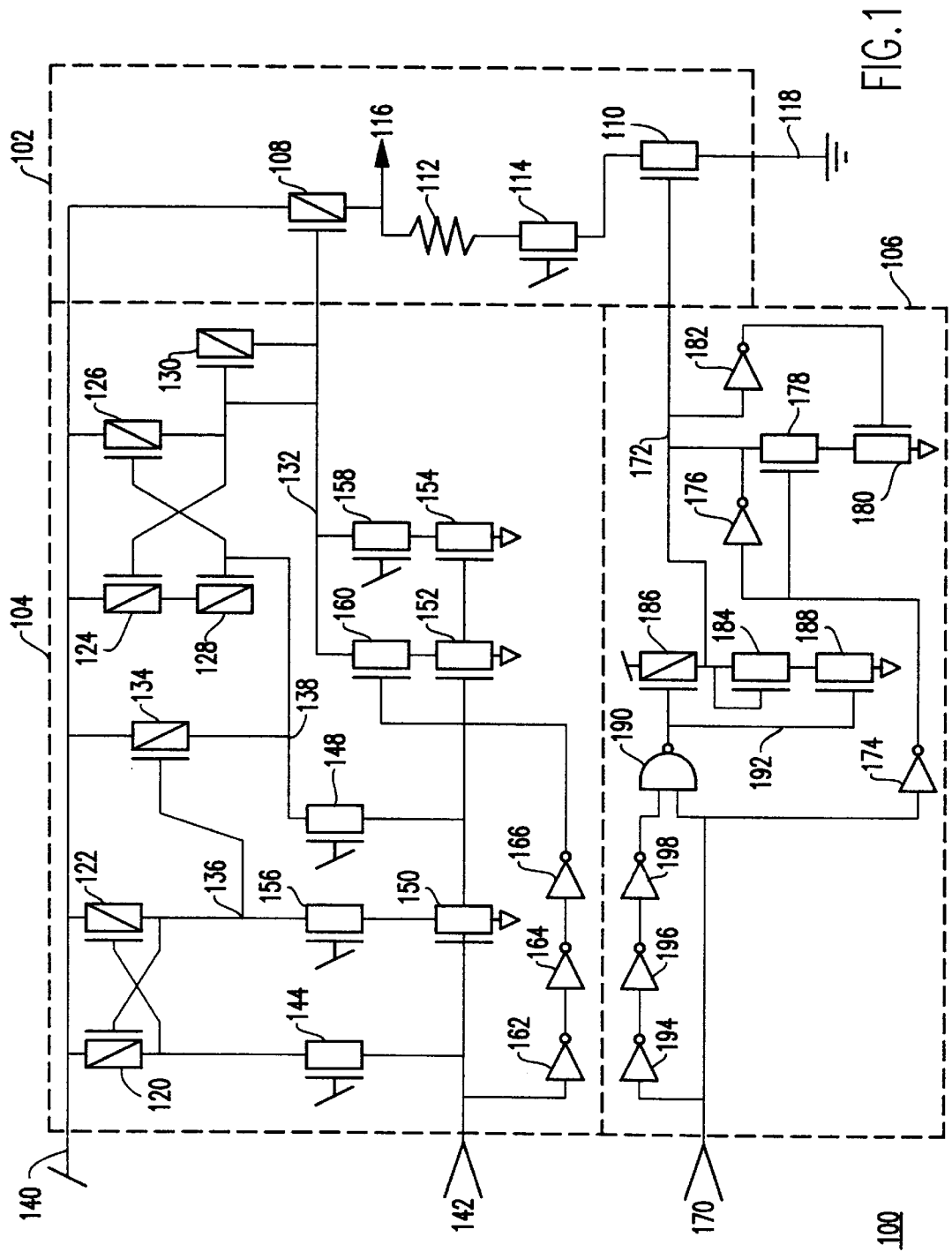
FIG. 1 is a schematic of a first preferred embodiment OCD with self regulating switching current

FIG. 1 is a schematic of a first preferred embodiment OCD 100 with self regulating switching current. The OCD includes a Driver 102, an Up-level Pre-drive 104 and a Down-level Pre-drive 106. Driver 102 drive-current mirrors and is controlled by Pre-driver current. The Pre-drive circuits 104, 106 each have an unbalanced input-dependent delay to quickly turn off/on both the on and off driver devices and, after a delay, reduce the drive on the turned on device to a steady state level.

The Driver 102 includes a Pull-up Field Effect Transistor (FET) 108 and a Pull-down FET 110. Preferably, an optional current limiting resistor 112 and punch-through protection FET 114 also are included. Driver FETs 108, 110 and 114 are typically at least 20 times wider than any of the other FETs in the OCD 100 and in some cases several hundred times wider. The current limiting resistor 112 is, preferably, ten ohms (10 Ω). Preferably, the current limiting resistor is tied between output 116 and the drain of punch-through protection FET 114, which is connected to the drain of Pull-down FET 110. The source of Pull-down FET 110 may be tied to a separate OCD ground 118.

The Up-level Pre-drive 104 includes two cross coupled P-type FET (PFET) pairs 120, 122 and 124, 126. Each PFET of each pair has its gate tied to the drain of the other PFET of the pair. The drain of each PFET of cross coupled pair 124, 126 is connected to the source of one of two PFET diodes 128, 130. The gate of Pullup FET 108 is connected to the drain-gate of PFET diode 130 at node 132. The drain of PFET 122 is connected to the gate of PFET 134 at node 136. The drain of PFET 134 is connected to the drain-gate of PFET diode 128 at node 138. The source of PFETs 120, 122, 124, 126 and 134 are tied to $V_h$ 140.

The drain of PFET 120 and node 138 are coupled to input 142 by N-type FETs (NFETs) 144, 148, respectively. Input 142 is also connected to the gates of NFETs 150, 152 and 154. The drain of NFET 150 is coupled to node 136 through NFET 156. The drain of NFET 154 is coupled node 132 though NFET 158. The gates of NFETs 144, 148 and 158 are tied to $V_h$ 140. NFET 160 selectively couples the drain of NFET 152 to node 132. The gate of NFET 160 is coupled to input 142 through an inverting delay provided by sequentially connected invertors 162, 164 and 166. The source of NFETs 150, 152 and 154 are all connected to ground.

The input 170 to Down-level Pre-drive 106 is coupled to the gate of Pull-down FET 110 at node 172 through a non-inverting turn-on path formed by sequentially connected invertors 174, 176. FET 178 is connected between node 172 and the drain of FET 180. The gate of FET 178 is connected to the output of inverter 174 at the input of inverter 176. The gate of FET 180 is coupled to Node 172 by inverter 182. The gate-drain of NFET diode 184 is connected to the drain of PFET 186 at node 172. The source of NFET diode 184 is connected to the drain of NFET 188. The gates of PFET 186 and NFET 188 are driven by the output of NAND gate 190 at node 192. A pulse circuit, formed by NAND gate 190 and sequentially connected invertors 194, 196 and 198 couple input 170 to node 192. The source of NFETs 180 and 188 are connected to ground.

The first preferred embodiment OCD 100 has three possible steady state conditions: high impedance (Hi-Z), high and low. In its HI-Z state, both OCD inputs 142 and 170 are low. Nodes 132, 136 and 192 are high and Nodes 138 and 172 are low.

In its high state, input 142 is high, input 170 is low and output 116 is high. Nodes 136 and 172 are low and Nodes 138 and 192 are high. NFETs 154 and 158 are both on, clamping Node 132 to a voltage determined by the bias point PFET diode 130. In this preferred embodiment, Node 132 is clamped at a voltage sufficient for Driver FET 108 to provide voltage and current meeting standard Transistor—Transistor Logic (TTL) up-level specifications, i.e., 5 milliamps (ma) at 2.4 volts.

In its low state, input 142 is low, input 170 is high and output 116 is low. Nodes 132, 136 and 192 are high and Node 138 is low. NFETs 184 and 188 are both on, clamping the output of inverter 176 at Node 172 to a voltage determined by the bias point of NFET diode 184. In this preferred embodiment, Node 172 is clamped at a voltage sufficient for Driver FET 110 to provide voltage and current meeting standard TTL down-level specifications, i.e., 5 ma at 0.6 volts.

Figure 2:
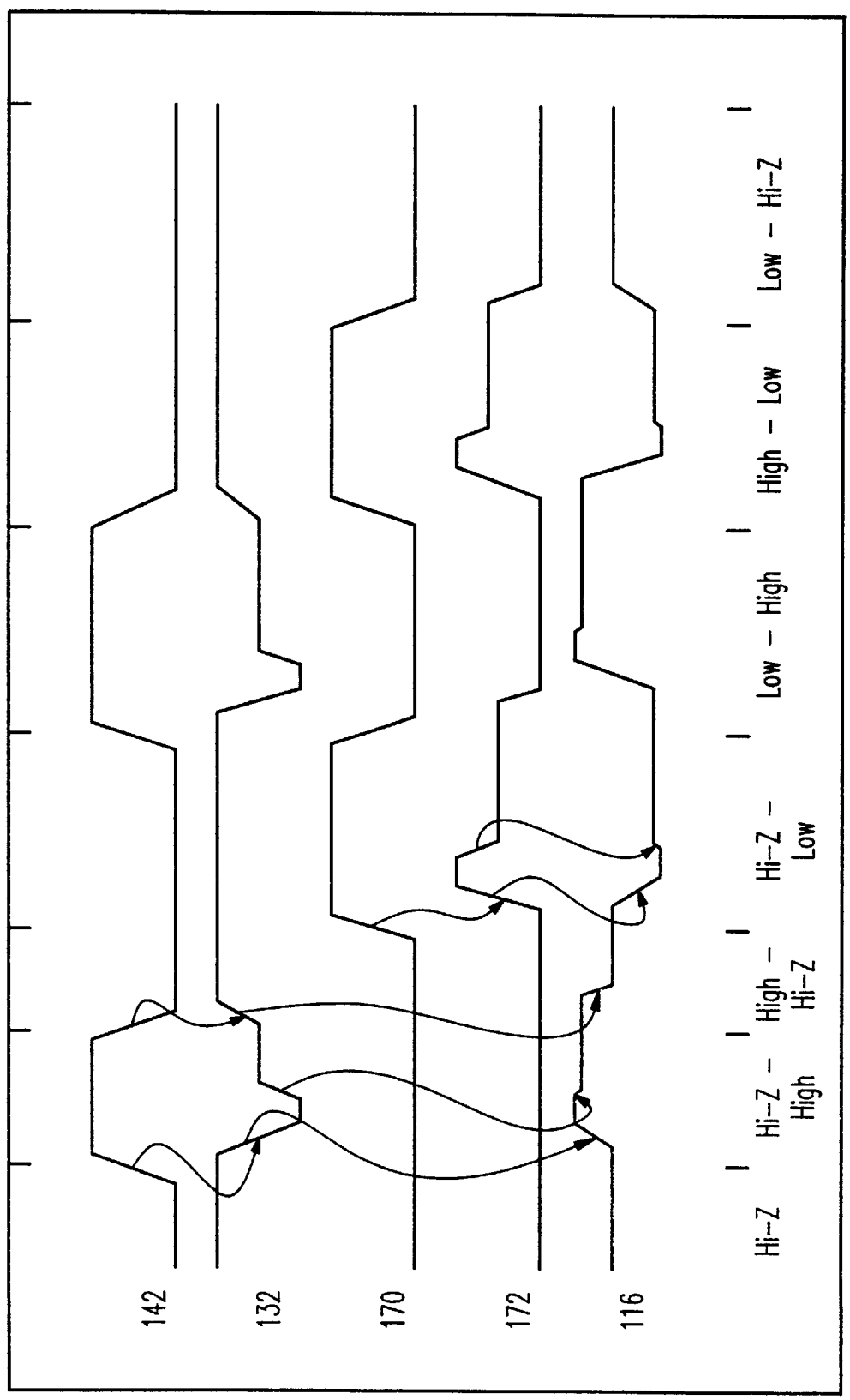
FIG. 2 is a timing diagram for the preferred embodiment OCD.

There are six possible state changes: Low to Hi-Z; High to Hi-Z; Hi-Z to low; Hi-Z to high; Low to high; and High to low. These six possible state changes are represented in the timing diagram of FIG. 2.

When the OCD 100 switches from low to Hi-Z, Input 142 remains low and input 170 is driven from a high to a low. The low on input 170 insures that the output of NAND gate 190 remains high. Inverter 174 inverts input 170, driving the input to inverter 176 and the gate to FET 178 high. Inverter 176 begins to pull node 172 low, starting to turn off Driver FET 110. Once node 172 falls past the switching point of inverter 182, inverter 182 switches, driving the gate of NFET 180 high, turning it on. With both NFETs 178 and 180 on, Node 172 is clamped low. Up-level Pre-driver 104 remains in its off state. The OCD is in its Hi-Z state.

When the OCD 100 switches from high to Hi-Z, Input 170 remains low and Input 142 is driven from a high to a low. The low on the gates of NFETs 150, 152 and 154 isolates NFETs 156, 158 and 160 from ground. The low on the source of NFETs 144 and 148 pulls the gate of PFET 122 and node 138 low. PFET 122 turns on, pulling node 136 high, turning PFET 134 off. The low on node 138 turns on PFET 126, pulling node 132 high, turning Driver FET 108 off. Down-level Pre-driver 106 remains in its off state. Again the OCD is in its Hi-Z state.

When the OCD 100 switches from Hi-Z to low, Input 142 remains low and, Input 170 is driven from a low to a high. The output of inverter 198 is high, so the output of NAND gate 190 switches to a low, both turning off NFET 188 to isolate NFET diode 184 from ground and, turning on PFET 186 to start pulling node 172 high. Coincident with the output of NAND gate 190 falling, inverter 176 switches and inverter 174 drives the gate of NFET 178 low, turning NFET 178 off. When inverter 176 switches, both PFET 186 and inverter 176 are supplying current to drive node 172 high. As Node 172 is charging, inverter 182 switches, turning off FET 180.

The capacitive load of the gate of Driver FET 110 is substantial, due to its size. PFET 186 and inverter 176 are selected such that the gate of Driver FET 110 is only partially charged before the high on Input 170 propagates through invertors 194, 196, 198 and NAND gate 190, driving 192 high again.

At this point, the voltage on Node 172 is at its maximum. The high on 192 turns PFET 186 off and NFET 188 on. With NFET 188 on, node 172 drops to its steady state voltage as described above.

When the OCD 100 switches from Hi-Z to high, Input 170 remains low and Input 142 is driven from a low to a high turning on NFETs 150, 152 and 154.

NFETs 152 and 154 begin to pull Node 132 low through NFETs 158 and 160, respectively. The high on Input 142 passes through NFETs 144 and 148, driving Node 138 high, turning off PFETs 122 and 126. Node 136 is pulled low through NFETs 150 and 156, turning on PFETs 120 and 134. PFET 134 clamps node 138 high, insuring that PFET 126 is turned off, which allows Node 132 to be pulled lower.

The capacitive load of the gate of Driver FET 108 also is substantial due to its size. NFETs 152, 154, 158 and 160 are selected such that the gate of Driver FET 108 is only partially discharged before the high on Input 142 propagates through invertors 162, 164 and 166, driving the gate of 160 low again. At this point, the voltage on Node 132 is at its minimum. The low on its gate turns NFET 160 off. Node 132 rises to its steady state voltage as described above.

The remaining two state changes, low to high and high to low may be described by the superposition of two of the four above described state changes. In a low to high transition: the Up-level Pre-drive 104 operation is as described in the above Hi-Z to high state change description; and, the Down-level Pre-drive 106 operation is as described in the above low to Hi-Z state change description. In a high to low transition: the Up-level Pre-drive 104 operation is as described in the above high to Hi-Z state change description; and, the Down-level Pre-drive 106 operation is as described in the above Hi-Z to low state change description.

Figure 3:
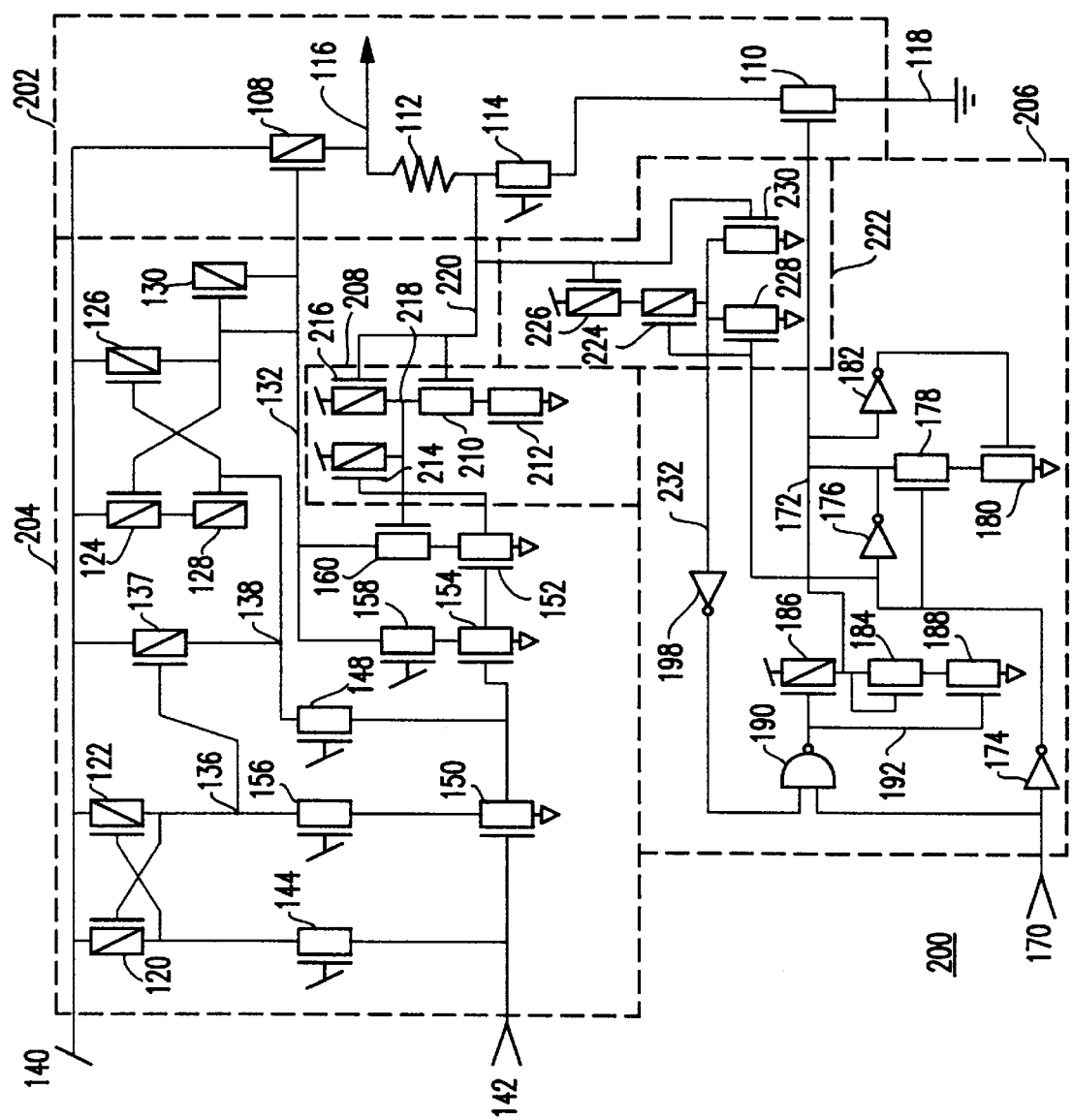
FIG. 3 is a schematic of a second preferred embodiment OCD 200 with self regulating switching current.

FIG. 3 is a schematic of a second preferred embodiment OCD 200 with self regulating switching current. The OCD 200 includes a Driver 202, which is identical to first embodiment Driver 102, an Up-level Pre-driver 204 and a Down-level Pre-driver 206. As with the first preferred embodiment, Driver 202 current mirrors and is controlled by Pre-driver current. Also as with the first preferred embodiment, the Pre-drive circuits 204, 206 each have an unbalanced input dependent delay to quickly turn off/on both the on and off driver devices and, after a delay, reduce the drive on the turned on device to a steady state level. In the second preferred embodiment, the delay is determined by the output voltage level. The description of the Driver 202 of the second preferred embodiment is identical to the above description of Driver 102.

The second preferred embodiment Up-level Pre-drive 204 is identical to first embodiment Up-level Pre-drive 104 except that sequentially connected invertors 162, 164 and 166 are replaced by a NAND gate 208. NAND gate 208 includes series connected NFETs 210 and 212 and parallel connected PFETs 214 and 216. The drain of NFET 210 is connected to the drains of PFETs 214 and 216 at 218. The source of NFET 212 is connected to ground. NAND gate 208 NANDs input 142 with Node 220 between current limiting resistor 112 and punch-through protection FET 114.

As with the first preferred embodiment Up-level Pre-drive 204, the second preferred embodiment Down-level Pre-drive 206 is identical to first embodiment Down-level Pre-drive 104 except that sequentially connected invertors 194, 196 are replaced by NOR gate 222 and its connection to node 218. NOR gate 222 includes series connected PFETs 224 and 226 and parallel connected NFETs 228 and 230 at Node 232. The drain of PFET 224 is connected to the drains of PFETs 228 and 230. The source of NFET 226 is connected to ground. NOR gate 222 NORs input 170 with Node 218.

The second preferred embodiment operates substantially the same as the first preferred embodiment except as would be expected, due to substitution of NAND gate 208 and NOR gate 222. In steady state: in Hi-Z, Node 218 is high and Node 232 is low; in the low state, both Nodes 218 and 232 are high; and, in the high state, both Nodes 218 and 232 are low.

Switching for this second preferred embodiment occurs as described for the first preferred embodiment, except for the difference provided by NAND gate 208 and NOR gate 222. When the OCD pulls the output 116 high, whether in a Hi-Z to high or low to high state change, NFET 212 turns on and PFET 210 turns off as Input 142 is driven high. However, Node 210 does not switch until Output 116 rises sufficiently that Node 220 turns on NFET 210 and PFET 216 off. At this point, when Node 218 falls, NFET 160 turns off, as in the first preferred embodiment, and Node 132 rises to its steady state level, as described above. Node 218 returns high when Input 142 returns low.

When the OCD pulls the output 116 low, whether in a Hi-Z to low or high to low state change, Inverter 174 passes a low to the gate of NFET 228 and PFET 224. However, Node 232 does not switch until Output 116 falls sufficiently that Node 220 turns off NFET 230 and turns on PFET 226. At this point, when Node 232 rises, inverter 198 passes a low to NAND gate 190, as in the first preferred embodiment, and Node 172 falls to its steady state level as described above. Node 232 returns low when Input 170 falls and inverter 174 drives the gate of NFET 228 and PFET 224 high.

Thus, as can be seen in both preferred embodiments, because the steady state drive of the on device has been reduced to that necessary to maintain the output at a specified logic level, e.g., a TTL up or down level, overlap current has been reduced significantly. Further, because transition current is essentially unaffected, performance is nearly that of an uncompensated OCD.

While the invention has been described in terms of preferred embodiments, those skilled in the art will recognize that the invention can be practiced with modification within the spirit and scope of the appended claims.

We claim:

1. An Off Chip Driver (OCD) having a high, a low and a high impedance (Hi-Z) state, said OCD comprising:
   an up-level pre-drive circuit selectively supplying a drive current representative of a first transition current for driving a first load to an up-level pre-drive current for clamping said first load to said up-level;
   a down-level pre-drive circuit selectively supplying a drive current representative of a second transition current for driving a second load to a down-level and a down-level pre-drive current for clamping said second load to said down-level; and
   a driver, said driver mirroring the drive current of said up-level pre-drive circuit and said down-level pre-drive circuit.

2. The OCD of claim 1 wherein the driver comprises:
   an up level FET coupling an up-level supply voltage to an output and mirroring said up-level pre-drive current; and
   a down level FET coupling a down-level supply voltage to said output and mirroring said down-level pre-drive current.

3. The OCD of claim 2 wherein the driver further includes a current limiting resistor connected between said output and said down level FET.

4. The OCD of claim 2 wherein the driver further includes a punch-through FET connected between said output and said down level FET.

5. The OCD of claim 2 wherein the up-level pre-drive and the down-level pre-drive each includes an input delay.

6. The OCD of claim 5 wherein said up-level pre-drive's input delay determines when said up-level pre-drive circuit switches from supplying said first transition current to said up-level current, and said down-level pre-drive's input delay determines when said down-level pre-drive circuit switches from supplying said second transition current to said down-level current.

7. The OCD of claim 2 wherein both a.) said up-level pre-drive circuit switches from supplying said first transition current to said up-level current and b.) said down-level pre-drive circuit switches from supplying said second transition level current to said down-level current responsive to an output voltage of said driver.

8. An Off Chip Driver (OCD) having a high, a low and a high impedance (Hi-Z)state, said OCD comprising:
   an up level FET coupling an up-level supply voltage to an output;
   a current limiting resistor connected to said output;
   a down level FET coupling a down-level supply voltage to said current limiting resistor;
   a load diode connected to the gate of said up level FET;
   an up level clamp connected to said load diode, said up level clamp maintaining said load diode at a fixed current when said OCD is in its high state;
   a transition current path connected to said load diode, said transition current path in combination with said up level clamp biasing said load diode into a first transition current;

a down level biasing clamp connected to the gate of said down level FET and maintaining a fixed drive current in said down level FET when said OCD is in its low state;

a selectable transition current source for biasing said down-level FET during a high to low transition; and a pulse circuit for selecting said selectable transition current source.

9. The OCD of claim 8 further comprising:

a first input delay deselecting said transition current path when a transition from a low to a high is complete; and a second input delay in said pulse circuit, said second input delay terminating pulses from said pulse circuit.

10. The OCD of claim 8 further comprising a punch-through FET connected between said current limiting resistor and said down level FET.

11. The OCD of claim 10 wherein the output is fed back to deselect the transition current path and to terminate pulses from said pulse circuit.

* * * * *